United States Patent [19]

Possin et al.

[11] Patent Number: 5,210,045
[45] Date of Patent: May 11, 1993

[54] DUAL DIELECTRIC FIELD EFFECT TRANSISTORS FOR PROTECTED GATE STRUCTURES FOR IMPROVED YIELD AND PERFORMANCE IN THIN FILM TRANSISTOR MATRIX ADDRESSED LIQUID CRYSTAL DISPLAYS

[75] Inventors: George E. Possin, Schenectady; Harold G. Parks, Scotia; Jack D. Kingsley, Schenectady, all of N.Y.

[73] Assignee: General Electric Company, Schenectady, N.Y.

[21] Appl. No.: 862,474

[22] Filed: May 18, 1992

Related U.S. Application Data

[60] Division of Ser. No. 303,091, Jan. 26, 1989, Pat. No. 5,148,248, which is a continuation of Ser. No. 104,918, Oct. 6, 1987, abandoned.

[51] Int. Cl.[5] .......................................... H01L 21/265
[52] U.S. Cl. ........................................ 437/42; 437/51; 437/181; 148/DIG. 43
[58] Field of Search ................. 437/42, 51, 48, 181, 437/40, 913; 148/DIG. 43, DIG. 150

[56] References Cited

U.S. PATENT DOCUMENTS

| 4,517,733 | 5/1985 | Hamano | 437/181 |
| 4,601,097 | 7/1986 | Shimbo | 357/30 |
| 4,624,737 | 11/1986 | Shimbo | 427/181 |
| 4,643,530 | 2/1987 | Yamazaki | 359/59 |
| 4,646,424 | 3/1987 | Parks et al. | 148/DIG. 131 |
| 4,667,217 | 5/1987 | Janning | 357/23.7 |
| 4,958,205 | 9/1990 | Takeda et al. | 357/30 |

FOREIGN PATENT DOCUMENTS

| 60-09167 | 1/1985 | Japan | 437/181 |
| 60-86863 | 5/1985 | Japan . | |
| 61-170724 | 8/1986 | Japan | 437/51 |
| 62-46574 | 2/1987 | Japan | 437/51 |

OTHER PUBLICATIONS

A 220×240 Pixel a-Si TFT Matrix Transmission LCD Suzuki et al; Proceedings of the SID, vol. 25/1, 1984 pp. 11-16.

(List continued on next page.)

Primary Examiner—Brian E. Hearn
Assistant Examiner—Michael Trinh
Attorney, Agent, or Firm—Donald S. Ingraham; Marvin Snyder

[57] ABSTRACT

A dual dielectric structure is employed in the fabrication of thin film field effect transistors in a matrix addressed liquid display to provide improved transistor device characteristics and also to provide both electrical and chemical isolation for material employed in the gate metallization layer. In particular, the use of a layer of silicon oxide over the gate metallization layer is not only consistent with providing the desired electrical and chemical isolation, but also with providing redundant gate metallization material to be employed beneath source or data lines for electrical circuit redundancy. Gate line redundancy is also possible. The electrical and chemical isolation provided by the dual dielectric layer reduces the possibilities of short circuits occurring in the display. The absence of short circuits together with the improved redundancy characteristics significantly increase manufacturing yield. As display sizes increase, the yield problem becomes more and more significant, generally growing as the square of the diagonal measurement of the screen. The structure in the present invention also significantly reduces gate leakage current. In the process and structure of the present invention, gate electrode material is separated from semiconductor material by the aforementioned dual dielectric, typically comprising layers of silicon oxide disposed beneath a layer of silicon nitride which is, in turn, disposed beneath the active amorphous silicon semiconductor material.

13 Claims, 5 Drawing Sheets

OTHER PUBLICATIONS

"Silicon TFTs for Flat Panel Displays", by F. Morin and M. LeContellec, *Hewlett Packaard Journal* (date unknown).

"Amorphous-Silicon Thin-Film Metal-Oxide-Semiconductor Transistors", by Hiroshi Havama and Masakiyo Matsumura, *Appliced Physics Letters*, vol. 36, No. 9 (May 1980).

"Amorphous Silicon-Silicon Nitride Thin Film Transistors" by M. J. Powell et al., *Applied Physics Letters*, vol. 38, No. 10 (May 1981).

"Application of Amorphous Silicon Field Effect Transistors in Addressable Liquid Crystal Display Panels" by A J Snell et al., Applied Physics, vol. 24, pp. 357-362 (1981).

"TFT-Addressed Liquid Crystal Color Display" by M. Sugata et al. (Oct. 1983), Proceedings of the Third International Display Research Conference, Paper No. 53.

"Amorphous-Silicon TFT Array for LCD Addressing" by M. V. C. Stroomer, *Electronic Letters*, vol. 18, No. 20 (1982).

"High Resolution Transparent-Type a-Si TFT LCDs" by K. Suzuki et al., *SID Digest*, (1983).

"Promise and Challenge of Thin-Film Silicon Approaches to Active Matrices" by A. I. Lakatos, 1982 International Display Research Conference, IEEE, pp. 146-151.

"Application of Amorphous Silicon Field Effect Transistors in Integrated Circuits" by A. J. Snell et al., *Applied Physics*, vol. A26, pp. 83-86, 1981.

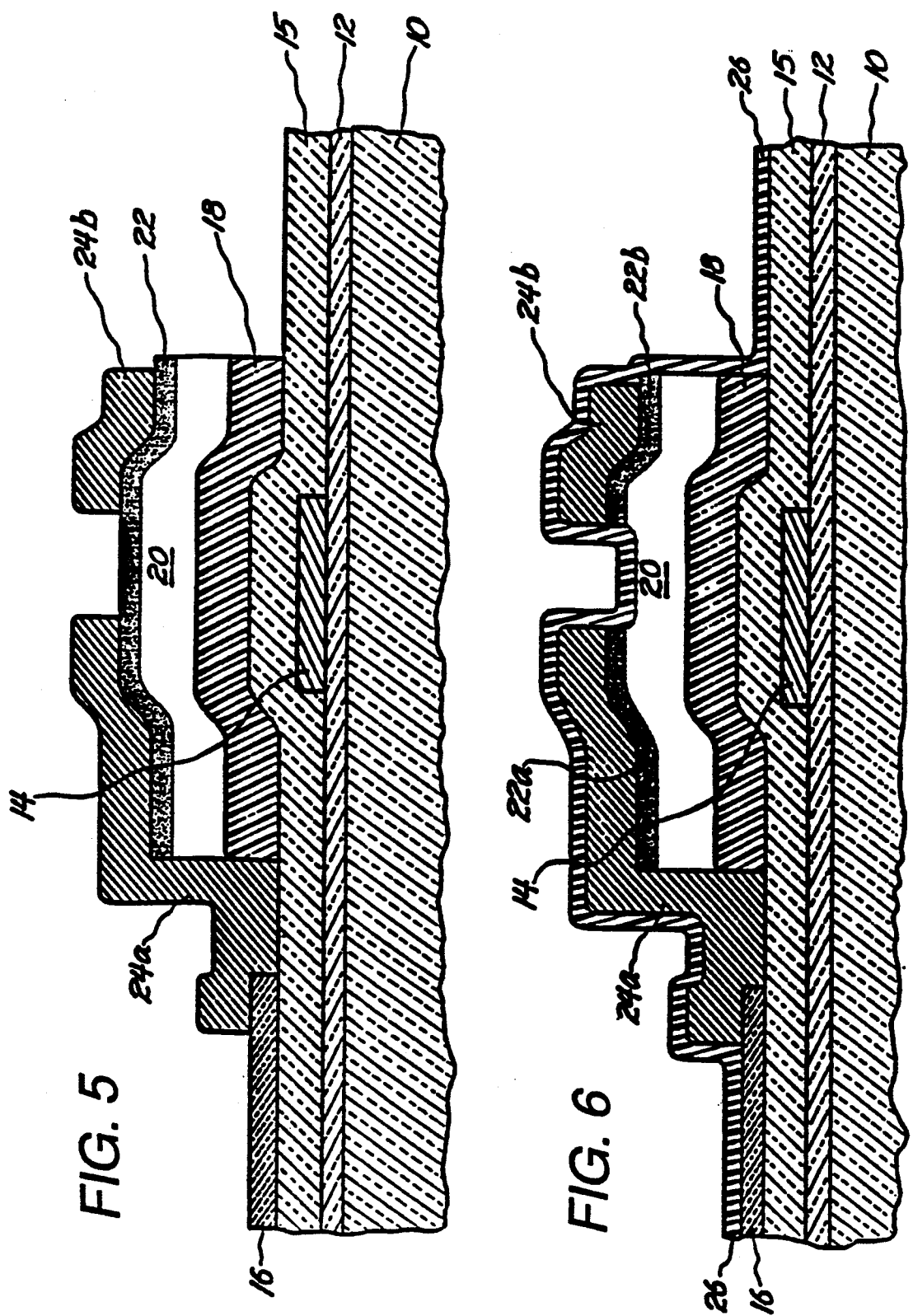

DUAL DIELECTRIC FIELD EFFECT TRANSISTORS FOR PROTECTED GATE STRUCTURES FOR IMPROVED YIELD AND PERFORMANCE IN THIN FILM TRANSISTOR MATRIX ADDRESSED LIQUID CRYSTAL DISPLAYS

This application is a division, of application Ser. No. 303,091, filed Jan. 26, 1989, U.S. Pat. No. 5,148,248, which is a continuation of application Ser. No. 104,918, filed Oct. 6, 1987, now abandoned.

BACKGROUND OF THE INVENTION

The present invention is generally directed to a process for the fabrication of thin film field effect structures useful in matrix addressed liquid crystal displays (LCDs). The present invention is also directed to structures produced in accordance with the process. More particularly, the present invention is directed to the utilization of dual dielectric materials for isolating gate metallization layer material from other conductive structures present in matrix addressed liquid crystal displays. Even more particularly, the present invention is directed to one solution for material process compatibility problems and to the problem of pixel element discharge during off cycles.

A liquid crystal display device comprises a pair of flat panels sealed at their outer edges and containing a quantity of liquid crystal material These liquid crystal materials typically fall into two categories: dichroic dyes and a guest/host system or twisted nematic materials. The flat panels generally possess transparent electrode material disposed on their inner surfaces in predetermined patterns. One panel is often covered completely by a single transparent "ground plane" or "back plane" electrode. The opposite panel is configured with an array of transparent electrodes, referred to herein as "pixel" (picture element) electrodes. Thus, a typical cell in a liquid crystal display includes liquid crystal material disposed between a pixel electrode and a ground electrode forming, in effect, a capacitor-like structure disposed between adjacent front and back panels.

It is noted that transparency is generally required for only one of the two panels and the electrodes disposed thereon.

In operation, the orientation of liquid crystal material is affected by voltages applied across electrodes disposed on opposite sides of the liquid crystal material. Typically, voltages applied to the pixel electrode effect a change in the optical properties of the liquid crystal material. This optical change causes the display of information on the liquid crystal display screen. In conventional digital watch displays and in some LCD screens used in miniature television receivers, the visual effect is typically produced by variations in reflected light. However, the utilization of transparent front and back panels and transparent electrodes also permits visual effects to be produced by transmissive effects. These transmissive effects may be facilitated by separately powered light sources for the display, including fluorescent light type devices. LCD display screens may also be employed to produce color images through the incorporation of color filter mosaics in registration with the pixel electrode array. Some displays may also employ polarizing filters to either enhance or provide the desired visual effect.

Various electrical mechanisms are employed to sequentially turn on and off individual pixel elements on an LCD screen. For example, metal oxide varistor devices have been employed for this purpose. However, the utilization of thin film semiconductor switch elements is most relevant herein. In particular, the switch element of the present invention comprises a thin film field effect transistor (FET) employing a layer of amorphous silicon. These devices are preferred in LCD devices because of their potentially small size, low power consumption, switching speeds, ease of fabrication and compatibility with conventional LCD structures. However, fabrication processes for certain desired semiconductor switch element structures have been found to be incompatible with the employment of certain materials used in the transparent LCD electrodes. It is seen that while certain physical FET structures or LCD devices are desirable, it is often extremely difficult to devise processes that satisfactorily produce the desired structure. Moreover, in any process of the kind contemplated herein, the number of masking steps is desired to be low since, in general, the greater the process complexity, the lower is the reliability of the resulting device and the process yield. One of the material problems that can arise in the fabrication of thin film FETs for LCD screens is the problem of providing good electrical contact between source and drain line metal and the amorphous silicon layer of the FET. In general, molybdenum is a desired metal to employ for source and drain electrode pads, but molybdenum may not exhibit good electrical contact with intrinsic amorphous silicon. A thin layer of aluminum disposed between the molybdenum and the amorphous silicon may be provided as discussed in previously filed application Ser. No. 761,939, filed Aug. 2, 1985, which is assigned to the same assignee as the present invention. However, care must be taken to avoid etchant compatibility problems with indium tin oxide which is preferably employed for the pixel electrodes. Moreover, aluminum has a tendency to diffuse into silicon material, thus potentially degrading device performance particularly if high temperatures are employed in subsequent process steps. Another problem encountered in LCD devices is the tendency for capacitive discharge to occur during off cycles. In this situation, the capacitor formed by the pixel electrode, the ground plane electrode and the liquid crystal material as a dielectric, tends to discharge through the FET if the FET device characteristics are inappropriate. In particular, it is desirable to limit FET current under conditions of reverse gate voltage. If the source-drain current is high under these conditions, capacitive leakage tends to occur and this can affect display quality. It is also desirable that the current-voltage characteristics do not exhibit large hysteresis loops since this can result in voltage uncertainty on the pixel electrode.

Attention is now specifically directed to particular problems of FET and LCD fabrication. In other processes for the manufacture of thin film FET devices on substrates for use in LCD displays, the gate and drain electrodes are formed on substantially the same plane. This arrangement has three undesirable effects. First, such arrangements permit gate metal to be exposed during later stages of processing. Since the gate metal may be attacked by subsequent process chemicals, this limits the choice of gate and also of source and drain materials as well as the choice of useful process procedures. One solution to this problem is the utilization of titanium as a gate metal and molybdenum as a source and/or drain metal. However, aluminum is a more desirable choice for the gate metal in that it exhibits a higher electrical conductivity and is more optically opaque than titanium. Optical opacity for gate material is desired to reduce light induced charge leakage through the FET. However, aluminum is attacked by most wet etchants which also etch molybdenum and can also react with indium tin oxide in the transparent pixel electrode material to produce a so-called "Swiss cheese effect" on the pixel elements.

Secondly, there is a significant possibility of short formation between the gate and source-drain and gate and pixel electrodes when these metal patterns occur on the same level of the substrate. These shorts often occur because of excess metal being left after photolithography and etching. It has been observed by the present inventors that occurrences of these excess metal defects result in significant yield limitation.

Thirdly, there is a possibility of leakage paths forming between the source and drain electrodes and the gate electrode along the edge of silicon/silicon nitride island structures which provide the foundation for thin film field effect transistors. Leakage paths also can form along the sidewalls of these islands. This problem can be increased by residues which are left after plasma and metal etching. This can cause leakage between the data line and the gate line and between the pixel electrode and the gate line, and in some cases, between the source (pixel electrode) and drain electrode. Data-line-to-gate-line leakage is undesirable because it causes an unnecessary load on the gate line drivers, and more importantly, it makes identification of other more significant leakage paths within the array more difficult. This can be a problem in testing and repair of the arrays. Other problems of leakage between the source and drain electrodes or between pixel and gate electrodes can also be very serious since such leakage increases the off current of the device and therefore, the decay rate of the charge stored on the pixel electrode. These leakage paths can be due to residues along the edges of the silicon islands. Scanning electron microscopic (SEM) examination indicates that residues can occur along this edge and devices with these residues often have increased off current levels.

SUMMARY OF THE INVENTION

In accordance with a preferred embodiment of the present invention, a process for the fabrication of thin film field effect transistors in active matrix liquid crystal display devices includes a process step in which a layer of silicon oxide is disposed over a previously disposed gate metallization layer pattern on an insulative substrate. Subsequently, a layer of silicon nitride, a layer of amorphous silicon and a layer of N+ doped amorphous silicon are deposited. The amorphous silicon and silicon nitride layers are patterned in an island structure disposed over portions of the gate metallization so as to form thin film field effect transistors. Pixel electrode material is disposed on the silicon oxide layer in an array pattern to provide the desired pixel electrodes. The source and drain metallization is subsequently disposed over the substrate and patterned so as to provide the desired field effect transistor and other circuit connections.

All of the problems referred to above are mitigated by the process of the present invention and the structure that results, the structure also forming one embodiment of the present invention. In particular, it is seen herein that gate metal is covered by a layer of silicon oxide over substantially the entire area of the array. This prevents short circuits from occurring between gate metal and other parts of the structure. In addition, the chemical protection provided by the silicon oxide layer permits a wider choice of gate metal material to be used. Silicon oxide is particularly advantageous in this invention because it is essentially not etched in low energy plasmas such as those produced by barrel etching using mixtures of $CF_4$ and oxygen. These mixtures have been found to be particularly advantageous for patterning amorphous silicon and silicon nitride. However, the present inventors have found that using only silicon oxide as a gate dielectric material produces field effect transistors having nonoptimal device characteristics, either because the quality of the silicon oxide to amorphous silicon interface is inferior as compared to the silicon nitride to amorphous silicon interface, or because there is residual oxygen doping of the amorphous silicon. In this invention, a dual dielectric layer of silicon oxide beneath a layer of silicon nitride is employed. The silicon nitride is deposited prior to deposition of amorphous silicon semiconductor material.

One of the advantages that results from the process of the present invention is the ability to deposit gate level material beneath source drive lines. Such lines are typically employed to drive a column of pixel array elements. However, it is possible that process defects could result in open circuits in this line. By depositing gate level material beneath significant segments of the source drive lines, a highly desirable redundancy can be created through the use of via openings in the silicon oxide layer. For purposes of understanding the latter advantages, it is important to distinguish three terms used herein. All of the terms refer to metal which is deposited in the gate layer. In particular, the term "gate metallization" refers to all conductive patterns deposited at this stage of processing. Not all of these patterns are necessarily contiguous or electrically connected. The term "gate electrode material" refers to that portion of the gate metallization patterning lying beneath thin film transistor island structures and which operates as the gate electrode in these transistors. As pointed out above, redundant gate metallization material may be deposited along paths over which source/drain metallization patterns are subsequently deposited on upper substrate levels. Thus, as used herein, the term "gate level metallization material" thus refers to and generally includes all of the following: redundant gate metallization material, gate electrodes and gate drive lines which drive individual rows of pixel electrodes.

Accordingly, it is an object of the present invention to provide an amorphous silicon field effect transistor structure which substantially isolates the gate metal and scan line addressing structures from the rest of the matrix display.

It is also an object of the present invention that this isolation be both chemical and electrical in nature.

It is yet another object of the present invention to reduce the possibility of parasitic leakage paths around the edge of silicon island thin film transistor structures so as to reduce the possibility that this leakage can contribute to increased off current levels.

It is a still further object of the present invention to reduce gate leakage currents.

It yet another object of the present invention to provide redundant source line metallization structures.

It is also an object of the present invention to reduce the possibility of shorts existing in LCD display structures.

It is yet another object of the present invention to expand the choices available for gate metallization material and also for source and drain metallization layer material.

Lastly, but not limited hereto, it is an object of the present invention to increase fabrication yield in matrix addressed liquid crystal display manufacturing processes.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 3-6 are cross-sectional side elevation views of a portion of an LCD pixel cell as existing in various steps of a process for manufacture in accordance with the present invention, the resulting structure being particularly shown in FIG. 6;

DETAILED DESCRIPTION OF THE INVENTION

Figure 1:
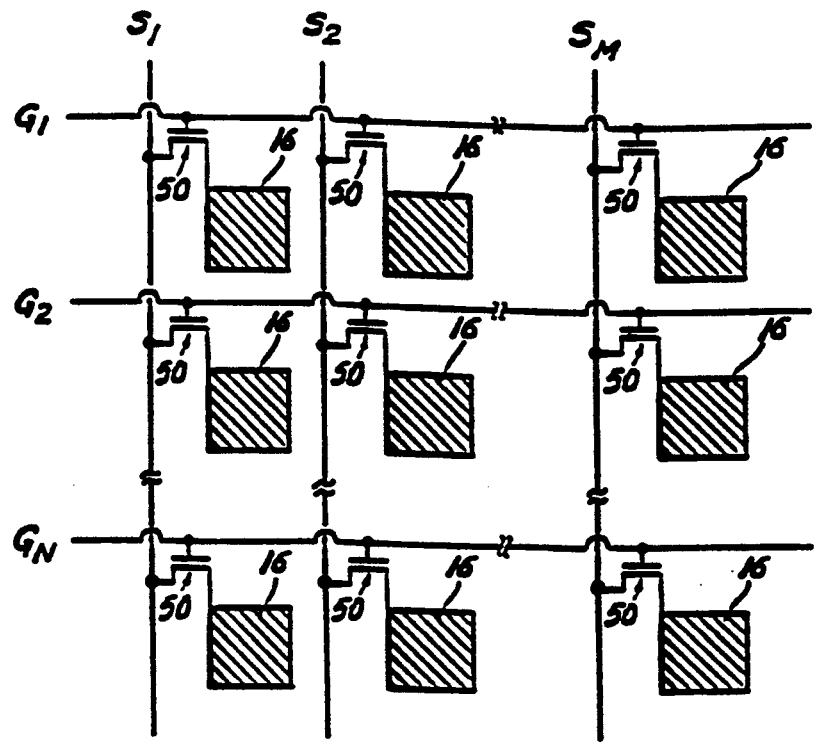
FIG. 1 is a partially schematic electrical circuit diagram illustrating the context in which the processes and structures of the present invention are employed.

FIG. 1 illustrates, in schematic diagram form, a matrix addressed liquid crystal display circuit. In particular, there is shown an N row by M column array of pixel electrodes 16 together with associated FET switching elements 50. The gate electrodes of the switching elements in row i are connected to gate drive line $G_i$. Likewise, the source electrode in each column j is connected to data or source line $S_j$. In the figure shown, j ranges from 1 to M and i ranges from 1 to N. It should be realized, however, that many FET structures are symmetric with respect to source and drain properties and that in many situations, the source and drain connections can be reversed. It can therefore become simply a matter of convention as to what is referred to as the source and drain connections. However, FIG. 1 particularly shows each pixel electrode 16 being connected to the "drain" of its associated switching FET. In operation, the pixel element in the $i^{th}$ row and the $j^{th}$ column is switched on by simultaneously applying appropriate signals to gate line $G_i$ and data or source line $S_j$. This applies a voltage to pixel electrodes 16 which acts to alter the optical properties of liquid crystal materials disposed between pixel electrode 16 and the ground plane or counter electrode (not visible in FIG. 1, see reference numeral 76 in FIG. 2). Pixel electrode 16 preferably comprises a transparent conductive material such as indium tin oxide.

Figure 2:
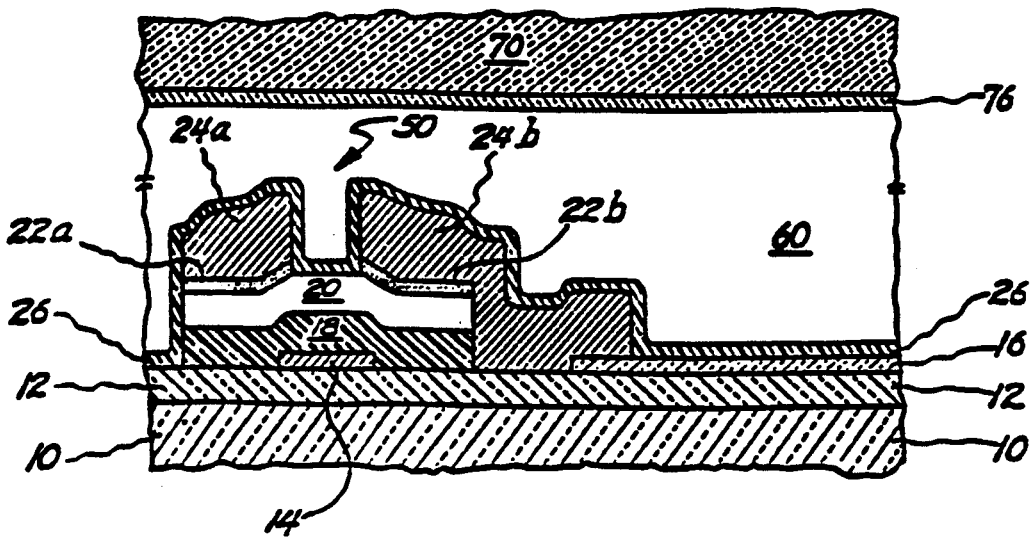
FIG. 2 is a cross-sectional side elevation view of a portion of an LCD pixel cell produced in accordance with process steps which do not include dual dielectric gate isolation.

FIG. 2 illustrates a portion of a liquid crystal display device which is not in accordance with the present invention. Even though the pixel cell portion shown in FIG. 2 does not correspond to structures or processes embodying the present invention, it is nonetheless instructive to consider it for the differences which will become apparent. More particularly, FIG. 2 illustrates both the upper and lower panels for an LCD display. Also illustrated is the physical relationship between the field effect transistor 50 structure and a pixel electrode 16. In FIG. 2 there is shown upper LCD panel 70 which typically comprises a material such as glass. Also disposed on the lower surface of panel 70 is a thin coating of a material such as indium tin oxide 76 which acts as a transparent counter electrode or ground plane electrode. Electrical potential differences appearing between ground plane electrode 76 and pixel electrode 16 produce optical variations in liquid crystal material 60 disposed between these electrodes. It is the optical effects produced by this potential difference which causes information to be displayed on the LCD screen. FET 50 and pixel electrode 16 are disposed on an insulative coating 12 on lower LCD display panel 10. Coating 12 typically comprises a material such as silicon dioxide. Panel 10 typically comprises a material such as glass. In general, panel 70, panel electrode 76, pixel electrode 16, coating 12 and panel 10 may all comprise transparent material. This is particularly useful in LCD displays in which back lighting is employed to form or assist in forming the desired image. However, it is only necessary for either upper panel 70 and coating 76 or lower substrate 10, together with its associated pixel electrode material, to be transparent.

As indicated above, pixel electrodes 16 are disposed on one of the LCD display panels. It is also necessary to connect each pixel electrode 16 with its associated semiconductor switching element 50. In the device shown in FIG. 2, semiconductor switching element 50 comprises an amorphous-silicon-based field effect transistor which includes gate electrode 14. While only a portion of electrode 14 is visible in the cross-section of FIG. 2, it must be kept in mind that the metallization pattern in this layer is disposed in a two dimensional fashion over a relatively flat substrate, forming not only gate electrode 14, but also gate lines $G_i$. In the structure illustrated in FIG. 2 moreover, there are more severe restrictions in the nature of the materials which may be employed for gate electrode 14. In particular, for structures such as those shown in FIG. 2, titanium is a preferred gate electrode material as long as process steps compatible with its use are employed. Over gate electrode 14, there is disposed an insulative layer 18 typically comprising a protective insulative material such as silicon nitride. Over insulative layer 18, there is disposed an active layer of amorphous silicon 20. In general, it is desirable to dispose source and drain electrodes in direct contact with active silicon material. However, desirable materials such as molybdenum employed in the source and drain metallization layer may not form good electrical contact with intrinsic amorphous silicon. Accordingly, it is therefore desirable to employ a layer of N+ doped amorphous silicon as an intermediate layer to facilitate and enhance the electrical connection to the amorphous silicon material. While aluminum may be employed for this purpose, the use of a layer of N+ doped amorphous silicon is preferred. In the structure shown in FIG. 2, this involves the fabrication of N+ amorphous silicon layers 22a and 22b for electrodes 24a and 24b, respectively. At the same time, drain electrode 24b and source electrode 24a are fabricated and disposed so as to provide electrical contact to pixel electrode 16, as shown. Finally, a layer of passivation material 26, such as silicon nitride, is disposed over the lower LCD display substrate. It should be noted in FIG. 2 that gate electrode 14, together with its associated gate drive lines (not visible therein), are in physical contact with layer 12 as is also indium tin oxide layer 16. It is seen from the structure of FIG. 2 that these two different layers are required to be deposited at approximately the same time during processing.

The discussion above, however, has pointed out several problems with respect to the processing and structure illustrated in FIG. 2. First, it is seen that the gate metal is exposed during later stages of LCD array processing. Additionally, there is also the possibility of short circuits existing between gate metallization and the pixel electrodes because these structures occur on the same level of the substrate. Third, there is a possibility of leakage paths forming between the source and drain electrodes and the gate electrode down the edges of the silicon/silicon nitride island and along the edges of the island structure.

Figure 3:
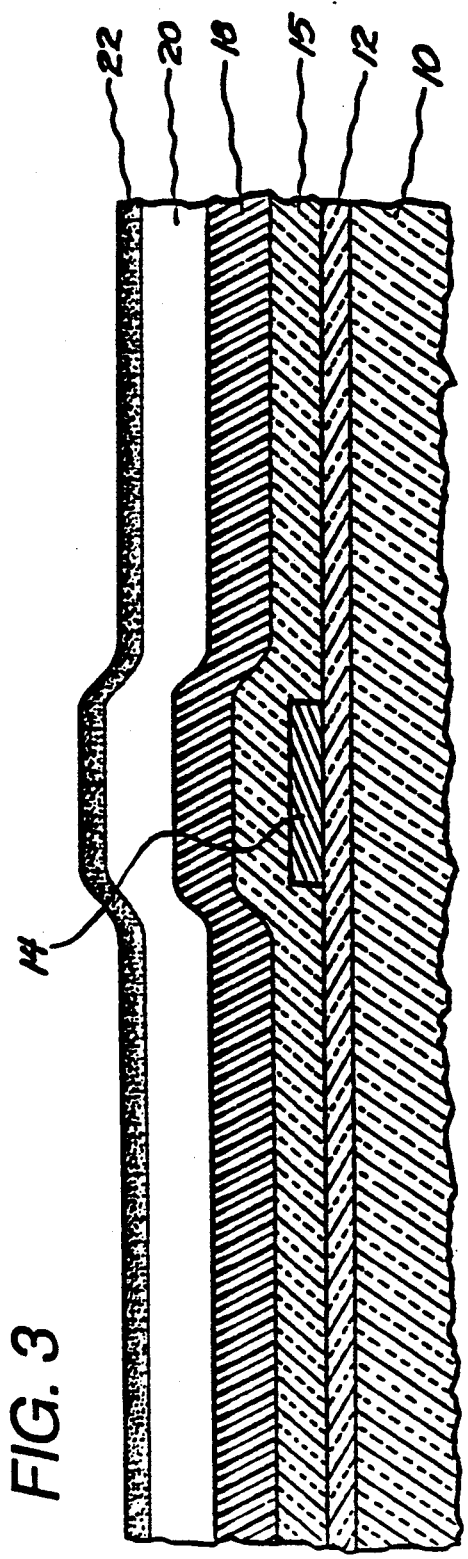

Specific attention is now directed to process steps carried out in accordance with the present invention which alleviate the problems potentially existing in the structure shown in FIG. 2 and the process steps engendered thereby. In processes in accordance with the present invention, gate metallization layer 14 is deposited on substrate 10, preferably by chemical vapor deposition (CVD). This substrate preferably includes a glass panel 10 upon which a layer 12 of silicon oxide has been deposited. Gate metallization layer 14 is patterned and etched to produce gate electrode structures, gate lines and redundant gate metallization material (if desired and as described above). Redundant gate metallization is preferably provided so as to be eventually disposed beneath source line $S_i$. Redundant gate metallization patterns actually comprise individual, electrically isolated island patterns which may be used to provide electrical circuit redundancy and increased yield. In the present invention, gate metal may comprise aluminum, gold, chromium, titanium, etc. In the case of titanium, gate metallization layer 14 may be plasma etched in a mixture of carbon tetrafluoride and 4% oxygen (by weight). Aluminum gate metallization material may be etched through the use of solutions such as PAWN (phosphoric, acetic and weak nitric acid solutions). FIG. 3 illustrates a portion of gate metallization layer 14 in the vicinity of an FET island.

Next, and most importantly for the practice of the present invention, a layer of silicon oxide is deposited, preferably by plasma assisted chemical vapor deposition. Silicon oxide layer 15, seen in FIG. 3, provides one of the dual dielectric materials referred to herein. Next, layer 18 of protective insulative material such as silicon nitride is deposited, preferably by plasma enhanced chemical vapor deposition (PECVD). A layer of amorphous silicon 20 is similarly deposited (PECVD) and finally, a layer of N+ doped amorphous silicon 22 is also similarly deposited by PECVD. The resultant structure is shown (in relevant part) in FIG. 3.

Figure 4:
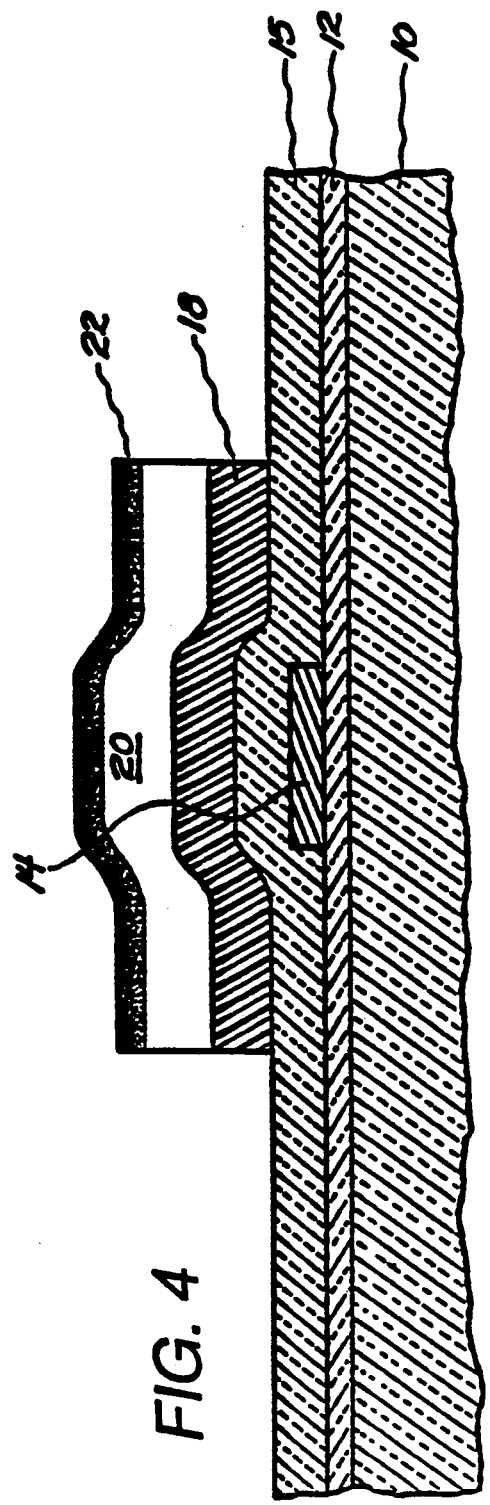

Next, these layers are patterned and plasma etched, preferably in a mixture of carbon tetrafluoride and 8% oxygen (by weight). Only the silicon and silicon nitride etch readily in this type of system. The silicon oxide remains over the entire surface of the wafer. This layer 15 is particularly visible in FIG. 4 which also particularly indicates the early stage of FET island formation.

Next, transparent pixel electrodes, preferably comprising indium tin oxide (ITO), are deposited and patterned either by etching or by lift off. Note that in particular, wet etching of indium tin oxide is possible at this stage of fabrication since any gate level metallization is protected from the indium tin oxide etchant. If desired, via holes may now be etched in silicon oxide layer 15 to permit contact to gate metal at the edges of the display and also to permit contact to redundant gate metallization patterning within the interior regions of the display. These interior via holes are desirable for providing redundancy for the source (that is, data lines). This permits use of gate metallization material as a bridge across segments of the source lines. This reduces the possibility of open source lines. It is also possible to etch via holes to provide redundancy in the in the gate drive lines, but this eliminates the advantage of minimizing shorts. Nonetheless, its other advantages still persist and is carried out in substantially the same way as providing source line redundancy.

At this stage of processing, source/drain metallization is deposited over the surface of the substrate, preferably by sputtering, and etched to form the source/drain and data line patterns, the etching being carried out in a PAWN solution. The resultant structure is shown in FIG. 5 in which source/drain metallization layer 24 has been etched to produce drain contact electrode 24a and source contact electrode 24b to N+ doped amorphous silicon layer 22, as shown in FIG. 5. Subsequently, the N+ amorphous silicon is removed from the channel region of the island structure to form an FET device. The substrate is capped with layer 26 passivating material, such as silicon nitride, preferably by plasma deposition. The resulting structure is shown in FIG. 6. It is noted that this process eliminates shorts between the gate or scan lines and the pixel electrodes or data lines due to excess metal or excess indium tin oxide.

In a preferred embodiment of the present invention, the doped N+ amorphous silicon layer is approximately 500 angstroms thick, the amorphous silicon layer is approximately 2,000 angstroms thick, the silicon nitride layer is between about 600 angstroms and 1,000 angstroms in thickness and the silicon oxide layer is between approximately 500 angstroms and 1,000 angstroms in thickness. These layers are formed preferably by plasma deposition.

Figure 7:
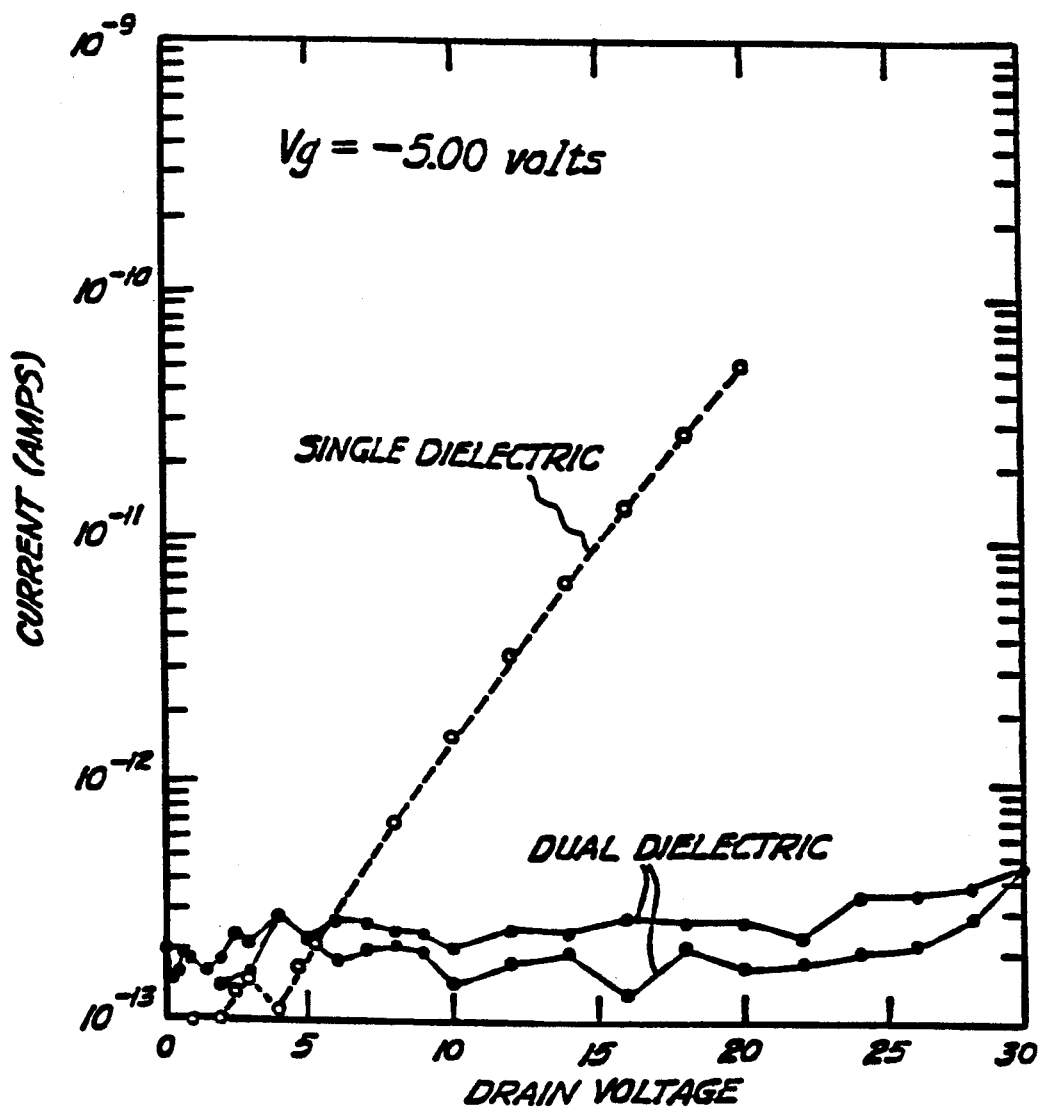
FIG. 7 is a plot of source/drain current as a function of drain voltage more particularly illustrating improved electrical characteristics for transistors made in accordance with the dual dielectric process of the present invention.

Pixel arrays having about 200 elements per side have been fabricated in accordance with the process of the present invention. Total detected shorts have been as low as 4 out of 40,000 pixel array elements. This is the lowest number of shorts yet achieved in the present process facility. It has been found that as little as 30 nanometers of silicon nitride in layer 18 produces devices with acceptable characteristics. This is a sufficient thickness of silicon nitride to achieve the desired quality interface with the amorphous silicon material and to protect the silicon from oxygen contamination. The resulting FET characteristics are very similar to devices processed only with silicon nitride gate dielectrics (see FIG. 2). As is clear in the present invention, there is a dual dielectric existing between gate electrode material 14 and amorphous silicon layer 20. Channel mobilities are approximately 0.5 cm$^2$/volt-second and threshold voltages are between approximately 1 and 3 volts. In addition, devices fabricated in accordance with the present invention exhibit very low OFF currents, these being typically less than approximately 1 picoampere out to drain voltages of more than 25 volts. Devices fabricated using single dielectric processes, as illustrated in FIG. 2, typically achieve OFF currents in this range only out to approximately 10 volts. FIG. 7 illustrates a comparison of the OFF current at a gate voltage of −5 volts for single dielectric and dual dielectric processes. It is clear that the dual dielectric process of the present invention is superior in its current characteristics.

Figure 8:
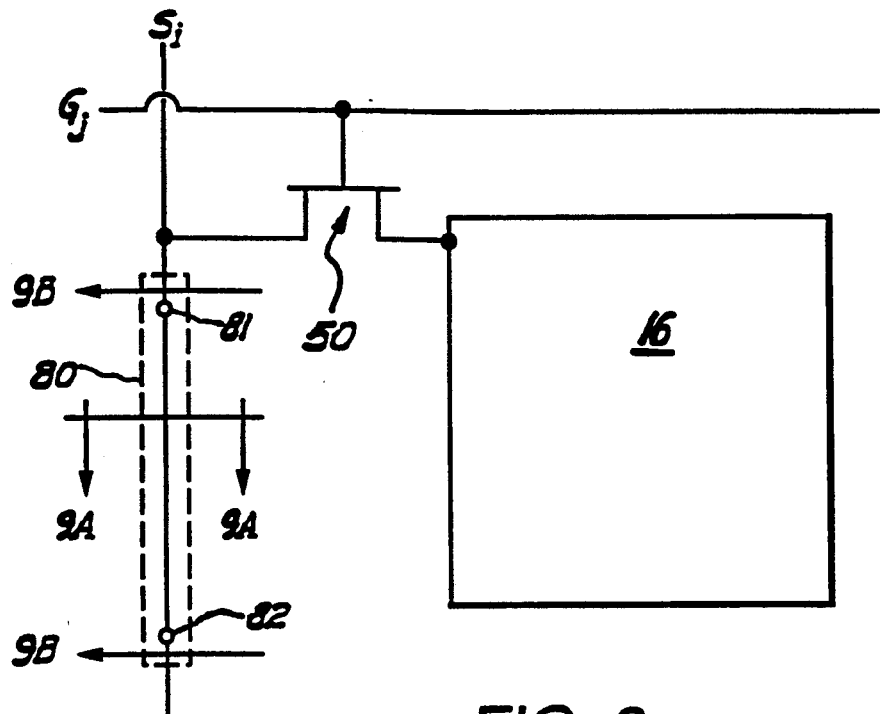
FIG. 8 is an enlarged view of a portion of the schematic of FIG. 1 more particularly illustrating location of redundant gate metallization material.
Figure 9A:
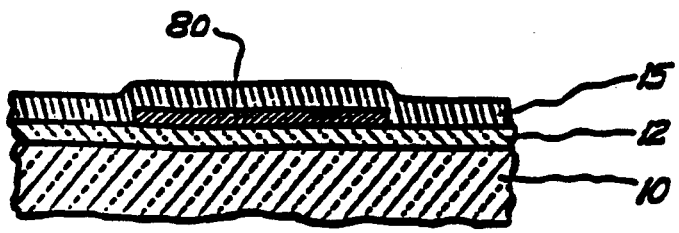
FIGS. 9A and 9B are cross-sectional side elevation views illustrating the redundant gate metallization structure and its relation to source drive lines.
Figure 9B:
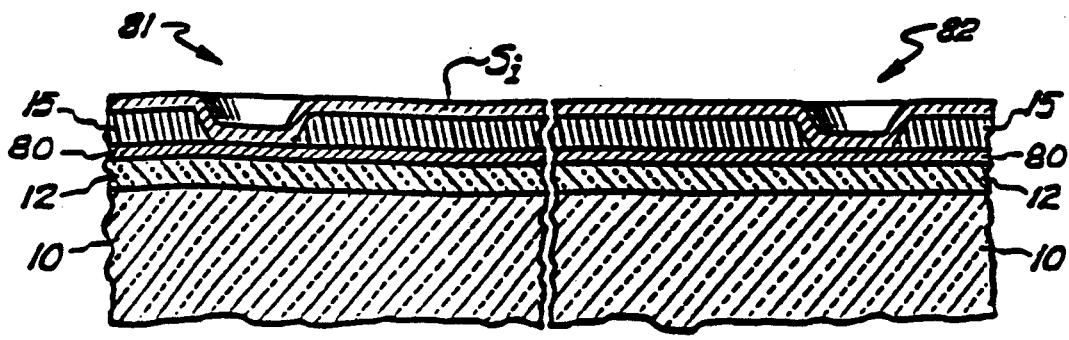

As indicated above, one of the advantages of the present invention is the capability of depositing gate level metallization material in locations which are particularly useful for providing source or data line redundancy. This is particularly advantageous as a mechanism for enhancing device yield, a fact of which becomes significantly more important as the size of the display increases. Such redundant gate level metallization material, however, is in fact not in any way directly electrically connected to the gate lines or the gate electrodes. With respect to this material, the "gate" portion of its name refers only to the fact that it is conveniently deposited at the same time (that is, during the same masking step) as the gate lines and gate electrodes and also conveniently comprises the same material. FIGS. 8 and 9 more particularly illustrate these capabilities. In particular, FIG. 8 illustrates region 80 beneath source line $S_i$ which may be provided with redundant gate metallization patterning. To achieve redundancy, via openings 81 and 82 are provided in silicon oxide layer 15 (not visible). Subsequent deposition of source line metallization patterns fills via openings 81 so that redundant gate line metallization makes contact to source line $S_i$ and provides a redundant connection between via openings 81 as shown in FIG. 8. Thus, any defects in source line $S_i$ are mitigated in this region. Cross-sectional views of this arrangement are more particularly seen in FIGS. 9A and 9B as shown. In this regard, it is particularly noted that layer 14 is indicated by a primed reference numeral to indicate that redundant gate metallization material is in fact part of an isolated metallization pattern and that its main connection with gate lines $G_j$ and gate electrodes is that it is deposited and patterned at the same time and comprises the same material. While it is not necessary to form the three different gate level metallization layer structures at the same time, to fail to do so only introduces needless process complexity.

It is noted that it is also possible to provide redundancy for gate line $G_i$ in a similar fashion, by providing via openings in layer 15 over line $G_i$. However, in this case, the redundant lines comprise source/drain metallization material and is disposed above, rather than below, layer 15.

Accordingly, from the above, it is seen that the process of the present invention satisfies all of the objectives stated herein. In particular, it is seen that the process of the present invention provides improved electrical and chemical isolation between gate metallization layer material and pixel electrode material. It is further seen that the process and structure of the present invention result in greater flexibility in the selection of materials. In particular, it is seen that the present invention readily permits the use of aluminum as a gate level metallization material and fully takes advantages thereby of its high electrical conductivity and light transmissive properties. It is also seen that, in one embodiment, the present invention can also provide potential redundancy for the source lines. Most importantly, it is seen that the present invention significantly improves fabrication yield. Such characteristics become increasingly important as display size increases.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A process for the fabrication of thin film field effect transistors in active matrix liquid crystal display devices, said process comprising the steps of:

disposing a gate metallization layer pattern on an insulative substrate, said pattern including gate electrodes and gate drive lines;

disposing a layer of silicon oxide over said insulative substrate and said gate metallization pattern;

disposing a layer of protective insulative material over said silicon oxide;

disposing a layer of intrinsic amorphous silicon over said protective insulative material;

disposing a layer of N+ amorphous silicon over said intrinsic amorphous silicon;

patterning said N+ amorphous silicon, said intrinsic amorphous silicon and said said protective insulative material down to the level of said silicon oxide, so as to form islands, whereby each island formed includes an N+ amorphous silicon layer, an intrinsic amorphous silicon layer and a protective insulative material layer;

disposing a pixel electrode pattern on said silicon oxide;

disposing a source and drain metallization layer over said island, said pixel electrode pattern and said silicon oxide; and patterning said source and drain metallization layer and said N+ amorphous silicon layer so as to form field effect transistor devices in electrical connection with said pixel electrode pattern.

2. The fabrication process of claim 1 in which said gate metallization layer pattern is disposed by chemical vapor deposition and plasma etching.

3. The fabrication process of claim 1 in which said pixel electrode pattern is disposed by sputter deposition and wet etching.

4. The fabrication process of claim 1 in which said protective insulative material is disposed by plasma enhanced chemical vapor deposition.

5. The fabrication process of claim 1 in which said amorphous silicon is disposed by plasma enhanced chemical vapor deposition.

6. The fabrication process of claim 1 in which said N+ amorphous silicon layer is disposed by plasma enhanced chemical vapor deposition.

7. The fabrication process of claim 1 in which said source and drain metallization layer is disposed by sputtering.

8. The fabrication process of claim 1 in which said source and drain metallization layer patterning includes etching in a solution of phosphoric acid, acetic acid and weak nitric acid.

9. The fabrication process of claim 1 further including disposing a silicon nitride passivation layer over said resulting substrate.

10. The fabrication process of claim 9 in which said silicon nitride passivation layer is formed by plasma deposition.

11. The fabrication process of claim 1 in which said gate metallization layer comprises material selected from the group consisting of aluminum, titanium, gold and chromium.

12. The fabrication process of claim 1 in which said source and drain metallization comprises molybdenum.

13. The fabrication process of claim 1 in which said pixel electrode pattern comprises indium tin oxide.

* * * * *